United States Patent
Denison

(10) Patent No.: US 8,866,263 B2
(45) Date of Patent: Oct. 21, 2014

(54) EMITTER BALLASTING BY CONTACT AREA SEGMENTATION IN ESD BIPOLAR BASED SEMICONDUCTOR COMPONENT

(75) Inventor: Marie Denison, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1173 days.

(21) Appl. No.: 11/863,971

(22) Filed: Sep. 28, 2007

(65) Prior Publication Data

US 2008/0169513 A1 Jul. 17, 2008

Related U.S. Application Data

(60) Provisional application No. 60/827,361, filed on Sep. 28, 2006.

(51) Int. Cl.
*H01L 23/48* (2006.01)
*H01L 27/02* (2006.01)
*H01L 23/00* (2006.01)
*H01L 27/06* (2006.01)

(52) U.S. Cl.
CPC ......... *H01L 27/0259* (2013.01); *H01L 27/0641* (2013.01); *H01L 24/05* (2013.01)
USPC ................. 257/584; 257/579; 257/E29.174; 257/E29.198; 438/309; 438/342

(58) Field of Classification Search
USPC .......... 257/579, 328, 335, 330–332, E29.198, 257/584, E29.174; 438/309, 312, 342
See application file for complete search history.

(56) References Cited

U.S. PATENT DOCUMENTS

| | | | | |
|---|---|---|---|---|
| 5,689,133 A * | 11/1997 | Li et al. | | 257/361 |
| 5,821,602 A | 10/1998 | Hebert et al. | | |
| 6,320,231 B1 * | 11/2001 | Ikehashi et al. | | 257/355 |
| 6,833,594 B2 * | 12/2004 | Kitamura | | 257/391 |
| 2002/0135046 A1 * | 9/2002 | Yu | | 257/579 |
| 2002/0153591 A1 | 10/2002 | Nakazato et al. | | |
| 2003/0030116 A1 * | 2/2003 | Yu | | 257/409 |
| 2003/0082882 A1 * | 5/2003 | Babcock et al. | | 438/309 |

\* cited by examiner

*Primary Examiner* — Robert Huber

(74) *Attorney, Agent, or Firm* — Jacqueline J. Garner; Frederick J. Telecky, Jr.

(57) ABSTRACT

Integrated circuits (ICs) utilize bipolar transistors in electrostatic discharge (ESD) protection circuits to shunt discharge currents during ESD events to protect the components in the ICs. Bipolar transistors are subject to non-uniform current crowding across the emitter-base junction during ESD events, which results in less protection for the IC components and degradation of the bipolar transistor. This invention comprises multiple contact islands (126) on the emitter (116) of a bipolar transistor, which act to spread current uniformly across the emitter-base junction. Also included in this invention is segmentation of the emitter diffused region to further improve current uniformity and biasing of the transistor. This invention can be combined with drift region ballasting or back-end ballasting to optimize an ESD protection circuit.

16 Claims, 10 Drawing Sheets

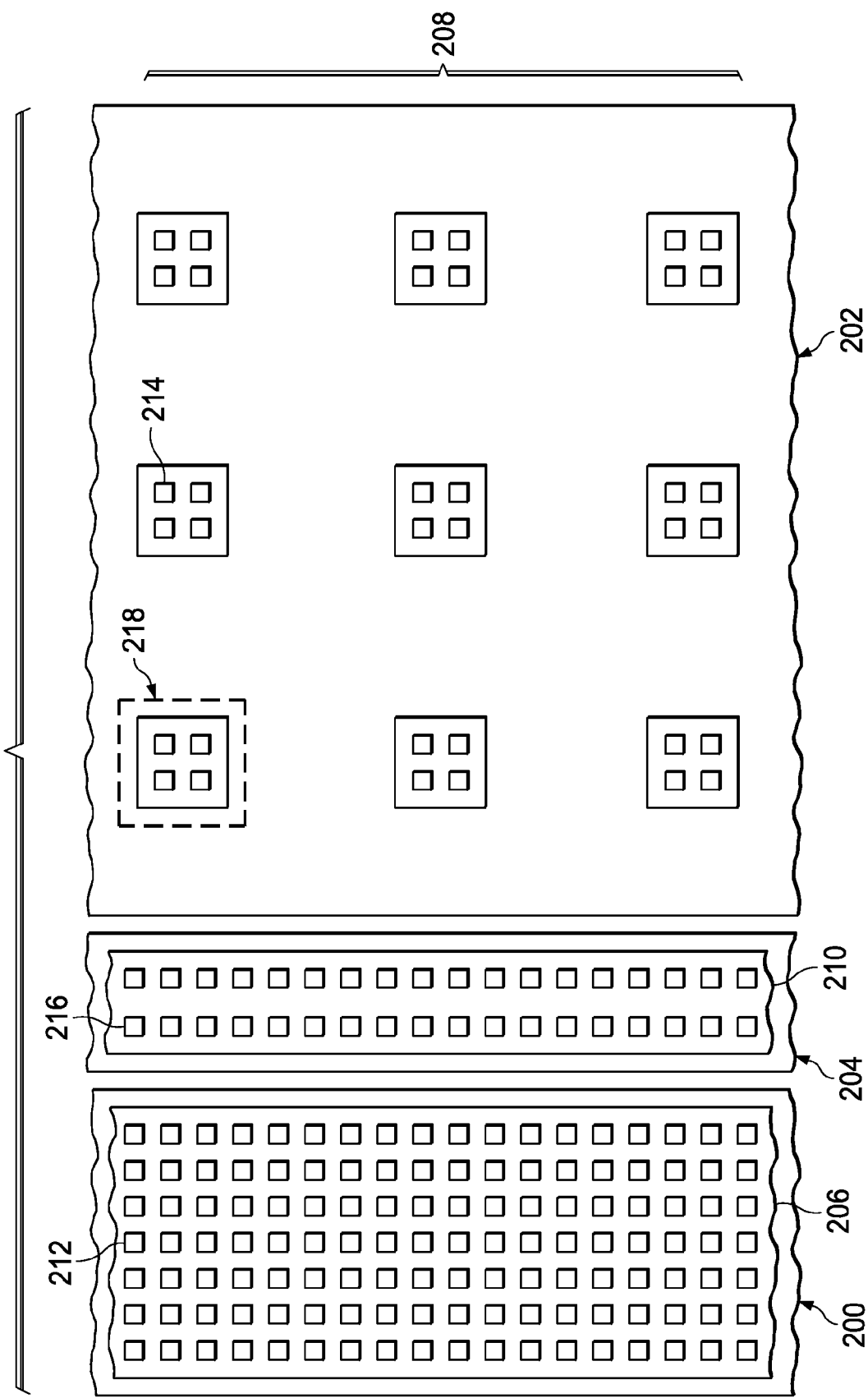

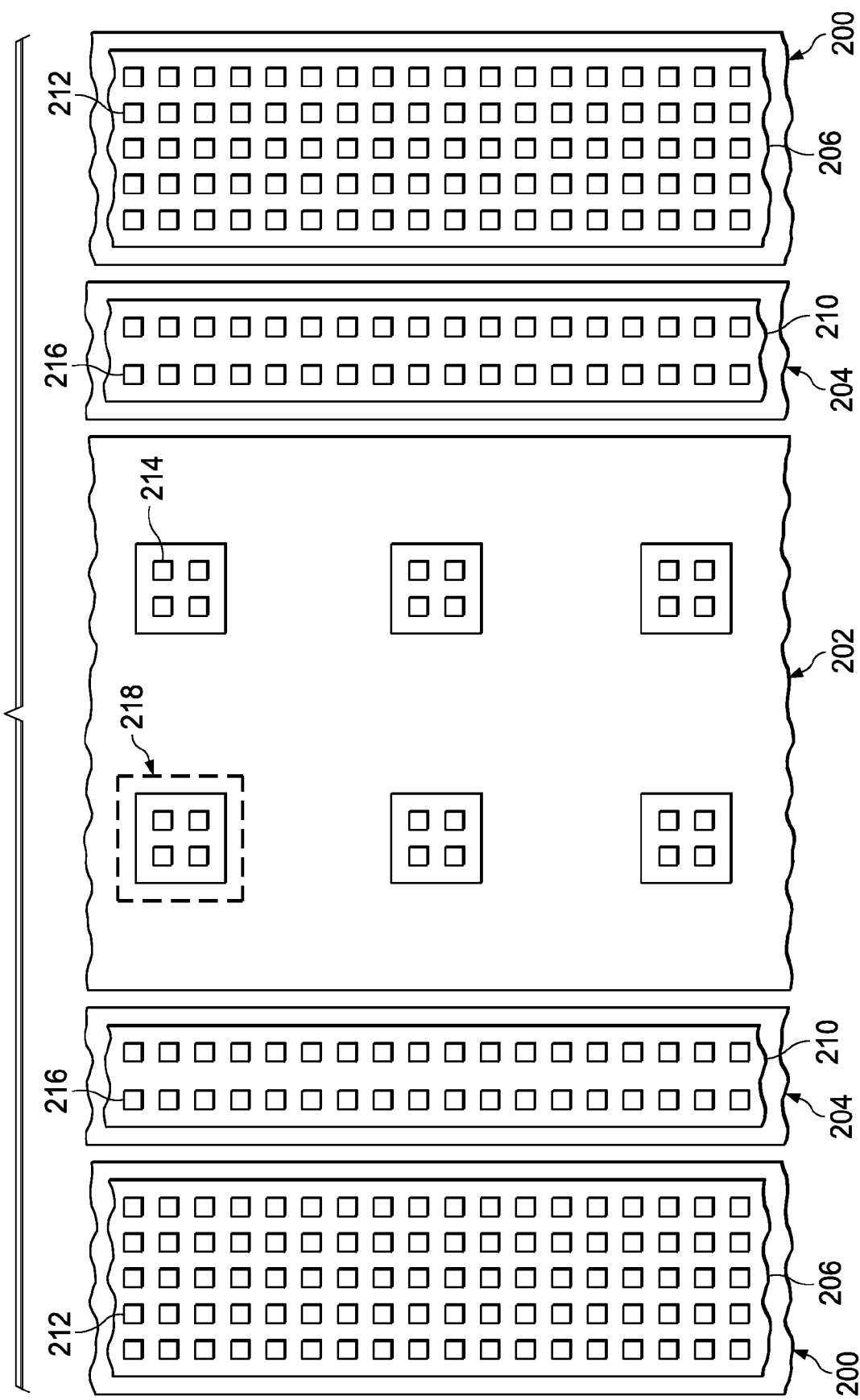

EMITTER BALLASTING BY CONTACT AREA SEGMENTATION IN ESD BIPOLAR BASED SEMICONDUCTOR COMPONENT

FIELD OF THE INVENTION

This invention relates to the field of integrated circuits. More particularly, this invention relates to bipolar transistors as independent components and as elements of electronic components in integrated circuits.

BACKGROUND OF THE INVENTION

It is well known that integrated circuits (ICs) are comprised of microelectronic components such as transistors, diodes, resistors, capacitors, etc., in a substrate, and metal interconnects which connect the components in circuits. It is furthermore well known that some internal nodes of an IC are connected to external nodes. Internal nodes of an IC are connected to external nodes by metal elements, known as Input-Output (IO) pads or bondpads, among other designations, on the top surface of an IC. IO pads are connected to external functions by various means, including wirebonding, bumpbonding, beamlead bonding, etc. By necessity, internal nodes of an IC that are connected to IO pads are exposed to the electrical environment of manufacturing processes and packaging and assembly processes. Moreover, in some applications, internal nodes are exposed to user electrical environments during the life of a product in which an IC is included. Electrical environments consist of static and time-varying electric and magnetic fields, and electric charge sources, such as humans with a static charge or electrically charged objects in close proximity to ICs. These features of electrical environments, especially charge sources, pose a significant danger to ICs. Charge sources are often at a much higher electrical potential than ICs. When charge sources come into close proximity to ICs, large potential differences between charge sources and ICs, typically between a few tens of volts and a few thousand volts, can cause a gap between them to become electrically conducting as a result of avalanche ionization and breakdown of a separating medium, usually air. The result of breakdown of a gap between a charge source and an IC is to partially or completely discharge the charge source into the IC, and is known as electrostatic discharge (ESD). Electrical currents associated with ESD are typically very high and can damage components of an IC.

In typical IC manufacturing and packaging and assembly operations, great care is taken to avoid exposing ICs to ESD hazards. Nevertheless, ICs are subject to ESD incidents. ESD protection devices and circuits in ICs are connected to bondpads to provide sufficient ESD immunity from typical IC manufacturing, packaging and assembly, and product end use environments.

Common electrical components in ESD protection circuits are bipolar transistors. Bipolar transistors are used to provide a low resistance shunt to ground during ESD events. In order to handle large currents associated with ESD events, bipolar transistors used in ESD protection circuits have large emitter-base junction areas, compared to transistors used for logic or signal processing circuits. Large junction areas are necessary to sustain the high power dissipated during ESD events and to minimize the voltage increase across the device at high current. Contacts and optional metal silicide uniformly distributed across the surface of the emitter, base and collector are used for uniform junction biasing and low resistive current conduction to the metal interconnects.

Current inhomogeneity and current crowding are well known to be issues in bipolar transistors in ESD protection circuits. Current crowding occurring during ESD events can result in permanent damage to bipolar transistors, causing loss of circuit functionality or shortened operating life of ESD protection circuit and IC.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

This invention comprises a segmented emitter contact region of a bipolar transistor into a plurality of contact islands separated by emitter diffusion drift regions, which act as a ballast network distributed around each contact island. Additionally, the emitter may be subdivided into a plurality of junctions, each with one or a plurality of contact islands separated by emitter drift regions. Furthermore, emitter ballast resistors can be connected in series with emitter contact islands. This invention also includes a method for fabricating an emitter with segmented contact region and segmented diffused regions.

DETAILED DESCRIPTION

For the purposes of this disclosure, a contact island is defined as a region containing a plurality of contacts wherein said contacts are spaced more closely to one another than to other contacts not in said contact island. If metal silicide is used in said contact island, the contact island extends to the boundaries of the metal silicide.

For the purposes of this disclosure, an emitter diffused region is defined as a contiguous region of IC substrate forming part or all of an emitter of a bipolar transistor, in which said contiguous region of IC substrate is doped the same type throughout. The boundary of said emitter diffused region extends to the boundary of the contiguous region of IC substrate with the same type doping as said emitter diffused region.

Figure 1:
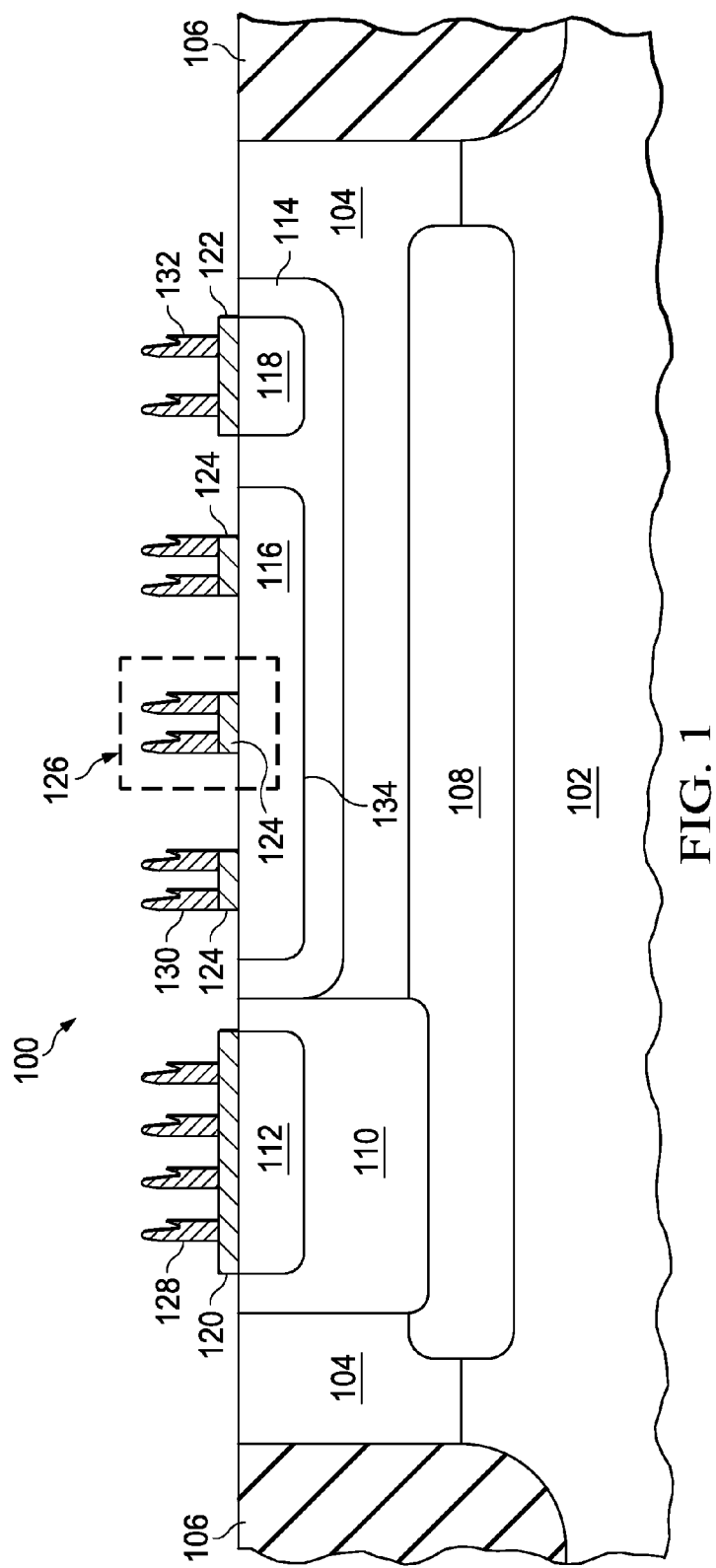
FIG. 1 is a cross-section of a bipolar transistor with multiple emitter contact islands according to an embodiment of the instant invention.

FIG. 1 is a cross-section of a bipolar transistor with multiple emitter contact islands according to an embodiment of the instant invention. An IC (100) includes a substrate (102), which may have an epitaxial layer (104), n-channel MOS (NMOS) transistors (not shown for clarity) and p-channel MOS (PMOS) transistors (not shown for clarity). In this example, the substrate is p-type silicon and the epitaxial layer is n-type silicon. The epitaxial layer may also be p-doped and counter-doped by a deep n-well. P-type regions (106) isolate the region of the bipolar transistor. An optional buried collector of n-type silicon (108) and n-type connector region (110) provide a low resistance path from the collector surface diffused region (112) to the base region (114). The collector surface diffused region (112) may be formed in the same process operations that form the source and drain region of N-channel MOS transistors in said integrated circuit. The emitter (116) of the bipolar transistor is n-type silicon, and is typically formed in the same operations as the collector surface diffused region at the surface of the wafer. The base region (118) at the surface of the wafer is p-type silicon, and may be formed in the same process operations that form the source and drain region of P-channel MOS transistors in said integrated circuit. The base well (114) is p-type silicon, and may be formed in the same process operations that forms the backgate well of n-channel MOS transistors in said integrated circuit. Base, emitter and collector regions may be separated by a thick isolation layer penetrating into the silicon (not shown for clarity), typically comprised of silicon dioxide, typically formed by local oxidation of silicon (LOCOS) or shallow trench isolation (STI). Metal silicide (120, 122, 124) may be formed on the top surfaces of the collector, base and emitter, respectively, to reduce the contact series resistance. A plurality of contact and metal regions (126), including silicide, if used, is formed on the top surface of the emitter. The contact and silicide area segmentation is advantageous as it results in a distributed emitter diffusion drift ballast resistance network which counteracts any local increase of current across the emitter during ESD stress and therefore suppresses or significantly delays current crowding. Bipolar transistors are prone to develop localized current filaments under ESD surge, and the current flow is unstable in the presence of any variation of electrical parameters across the transistor. If ESD collector-emitter current tends to increase in some region within the emitter area, the voltage drop across a local emitter ballast will cause a decrease of the effective base-emitter voltage difference in this region, resulting in a decrease of ESD collector-emitter current in this segment. Another advantage of emitter contact segmentation is increased bipolar gain in technologies based on advanced CMOS processes. In advanced CMOS ICs, junction depths of diffused regions 114, 116 and 118 are very shallow, especially if they are silicided, resulting in an, resulting in lower bipolar transistor gain in advanced CMOS ICs due to increased injection of base majority carriers into emitter contact regions. Emitter contact segmentation reduces this injection, and thus increases bipolar transistor gain.

Contacts are made to the collector (128), to the emitter (130) and to the base (132) to connect the bipolar transistor to the ESD protection circuit. The area of the emitter-base junction (134) is sized appropriately to carry the anticipated ESD discharge current and power at a desired voltage drop. If silicide is used, the metal silicide islands over the emitter is preferably offset from the edge of the emitter diffused region to form a drift region along an edge of the emitter. A base region may be placed between a collector and an emitter, if no lateral bipolar component is required.

External resistors, such as polysilicon resistors or metal interconnect meander resistors, may be connected to each emitter contact island to increase ballasting.

It will be recognized by those familiar with bipolar transistor fabrication that a bipolar transistor of opposite polarity from that described in reference to FIG. 1, namely a pnp bipolar transistor, may be fabricated to have a plurality of contact islands on an emitter, by following the discussion in reference to FIG. 1, with an appropriate change in doping of some elements, including the collector, base and emitter.

FIG. 2 is a set of top views of bipolar transistors according to embodiments of the instant invention. Referring to FIG. 2A, a collector (200) is near an emitter (202) and a base (204). The collector (200) may have a layer of metal silicide (206) that may be coterminous with the collector (200). Collector may include a buried layer (not shown for clarity) under emitter and base or extending from the deep collector (110) toward the base. Base (204) may have a layer of metal silicide (210) that may be coterminous with base (204). Collector (200) is contacted by metal vias (212). Base (202) is contacted by metal vias (216). Emitter (202) is contacted by metal vias (214). The groups of metal vias (214) in combination with metal silicide islands, if used, over the emitter (202) form contact islands (218). Emitter (202) has a plurality of contact islands (208) with optional metal silicide. Contact islands (218) may be any shape, including, but not limited to, square, rectangular, hexagonal, circular or oval. Contact islands (218) need not be uniform in size or shape. Contact islands may be configured concentrically. ESD discharge current produces a voltage drop that debiases the base-emitter junction around the contact islands, impeding any significant increase of current flowing through each contact island and thereby effectively maintaining a balanced sharing of ESD discharge current between the contact islands on the emitter. In an ESD event, an avalanche region is located near the buried collector, and ESD current flows from the discrete contact islands (218) to a homogeneous power dissipating region under the base. Emitter contact area segmentation produces a more uniform current distribution across the base, resulting in a higher current capacity than would be possible in absence of emitter contact segmentation.

Figure 2B:
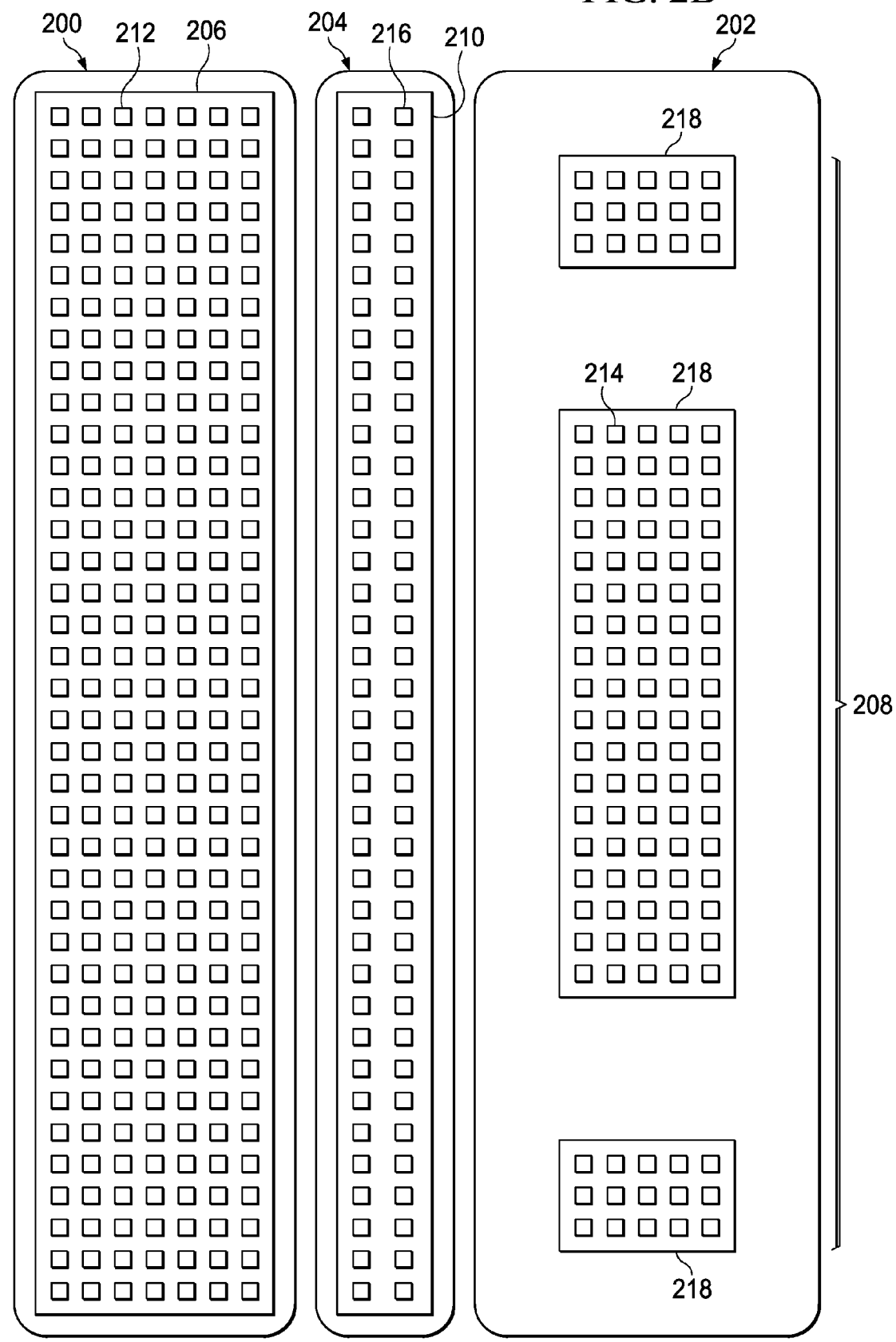
FIG. 2 is a set of top views of bipolar transistors according to embodiments of the instant invention.

The layout depicted in FIG. 2A is an asymmetric bipolar transistor. It is within the scope of this invention to have other transistor layouts with emitter segmentation, including symmetric layouts. Referring to FIG. 2B, a collector (200) is near an emitter (202) and a base (204). The collector (200) may have a layer of metal silicide (206) that may be coterminous with the collector (200). Collector may include a buried layer (not shown for clarity) under emitter and base or extending from the deep collector (110) toward the base. Base (204) may have a layer of metal silicide (210) that may be coterminous with base (204). Collector (200) is contacted by metal vias (212). Base (202) is contacted by metal vias (216). Emitter (202) is contacted by metal vias (214). The groups of metal vias (214) in combination with metal silicide islands (208), if used, over the emitter (202) form contact islands (218). Emitter (202) has a plurality of contact islands (208) with optional metal silicide, configured in this embodiment to reduce current crowding at the ends of emitter (202). Size and shape of contact islands (218) may be any shape, including, but not limited to, square, rectangular, hexagonal, circular or oval. Contact islands (218) need not be uniform in size or shape. ESD discharge current produces a voltage drop that debiases the base-emitter junction around the contact island at the emitter end, effectively impeding an increase in the discharge current density at this position compared to the remaining of the emitter area. In an ESD event, an avalanche region is located near the buried collector, and ESD current flows from the discrete contact islands (218) to a homogeneous power dissipating region under the base. Emitter contact area segmentation as shown in FIG. 2B produces a more uniform current distribution across the base, resulting in a higher current capacity than would be possible in absence of emitter contact segmentation. FIG. 2C depicts another embodiment of the instant invention, in which an emitter (202) is located between two bases (204), which are located between two collectors (200). The configuration depicted in FIG. 2C is advantageous because current capacity is increased.

FIG. 3 is a set of top views of contact islands to emitters of bipolar transistors in ESD protection circuits in other embodiments of the instant invention.

Figure 3A:
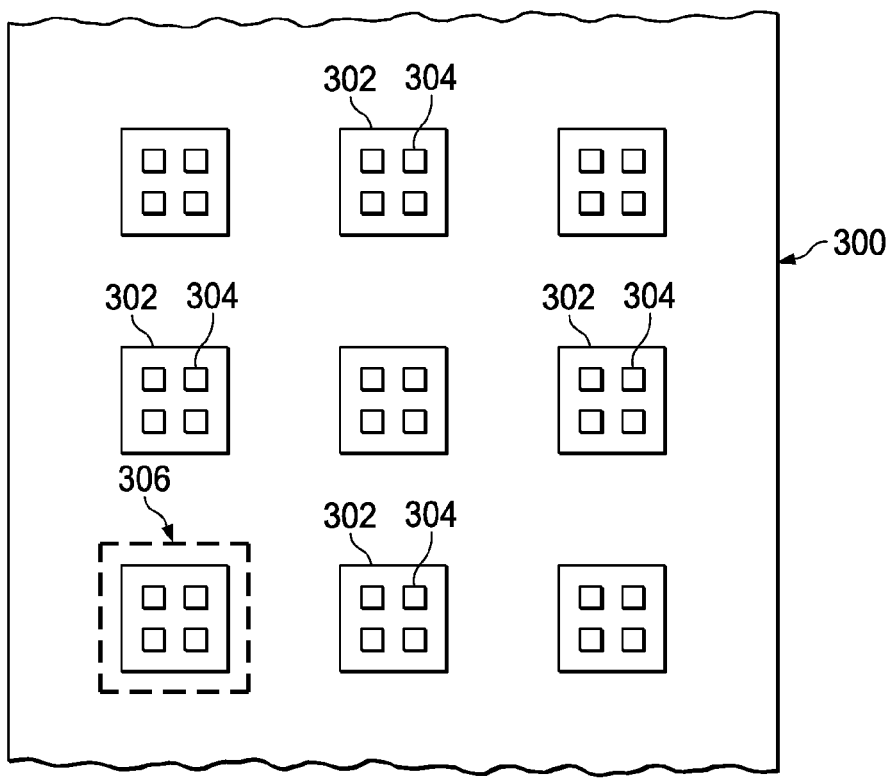
FIG. 3 is a set of top views of contact islands to emitters of a bipolar transistors according to embodiments of the instant invention.

FIG. 3A depicts an embodiment of the instant invention with a single emitter diffused region (300) with a plurality of arbitrarily shaped contact islands (302) that are contacted by metal vias (304), and a drift region ballast around each contact island (302). If silicide is used, the boundary of each silicide region extends to the boundary of the corresponding contact island. If silicide is not used, the contacts are configured in a plurality of contact islands (306). This configuration optimizes the current distribution in bipolar transistors with emitter lengths longer than a typical current filament.

Figure 3B:
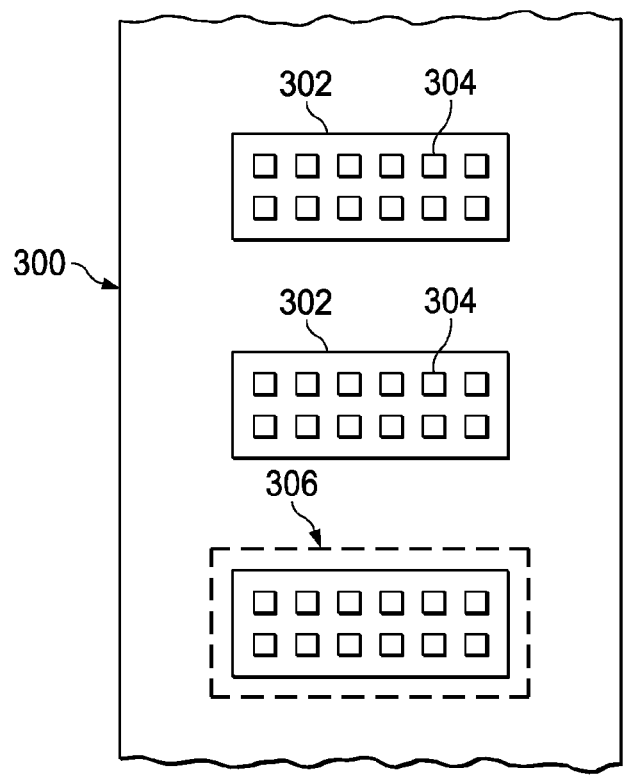
Figure 3C:
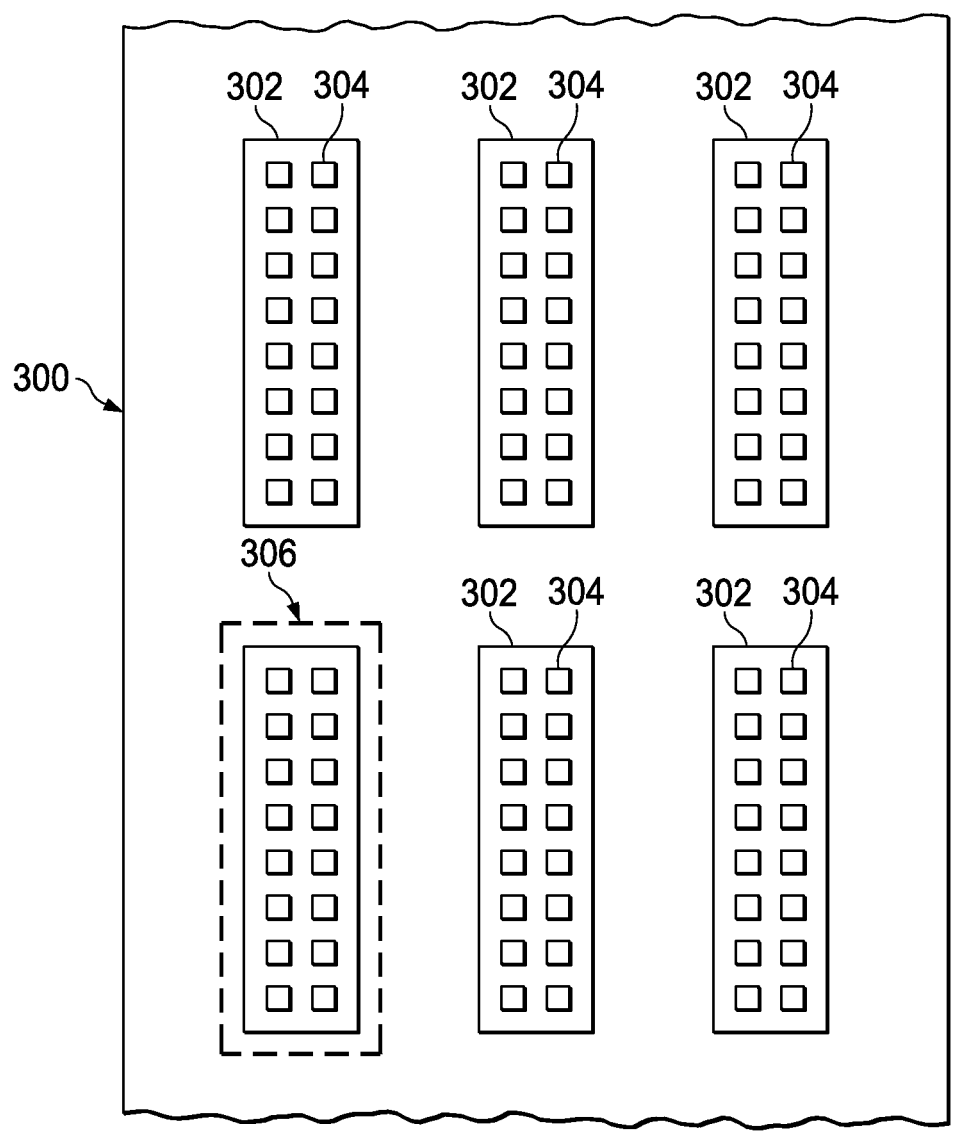

FIG. 3B depicts another embodiment of the instant invention with an emitter (300) with a plurality of elongated contact islands (302) that are contacted by metal vias (304). If silicide is used, the boundary of each silicide region extends to the boundary of the corresponding contact island. If silicide is not used, the contacts are configured in a plurality of contact islands (506). This configuration is advantageous for bipolar transistors with emitter lengths comparable to a typical current filament extent. FIG. 3C depicts another embodiment of the instant invention with an emitter (300) with a plurality of elongated contact islands (302) that are oriented parallel to a long axis of the emitter. The configuration depicted in FIG. 3C is advantageous for some ranges of doping and geometry of emitter and collector regions.

It is within the scope of this invention to have bipolar transistors with a single emitter diffused region having other configurations of collector, base and emitter regions, including, but not limited to, circular, oval, interleaved combs, and square.

Figure 4:
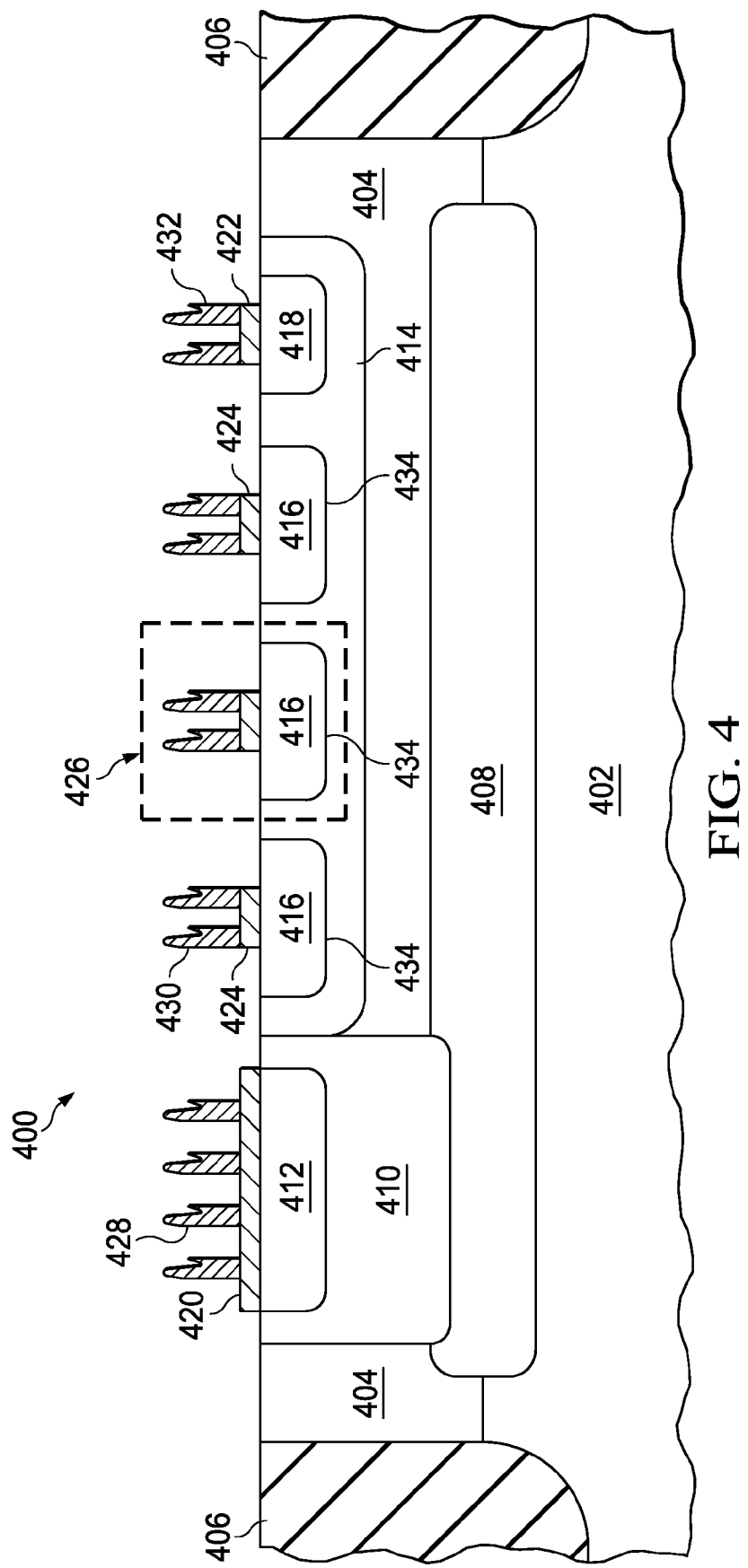
FIG. 4 is a cross-section of a bipolar transistor with multiple diffused regions in the emitter according to an embodiment of the instant invention.

FIG. 4 is a cross-section of a bipolar transistor with a plurality of emitter diffused regions in an emitter according to another embodiment of the instant invention. An IC (400) includes a substrate (402), which may have an epitaxial layer (404), n-channel MOS (NMOS) transistors (not shown for clarity) and p-channel MOS (PMOS) transistors (not shown for clarity). In this example, the substrate is p-type silicon and the epitaxial layer is n-type silicon. The epitaxial layer may also be p-doped and counter-doped by a deep n-well. P-type regions (406) isolate the region of the bipolar transistor. A buried collector of n-type silicon (408) and n-type connector region (410) provide a low resistance path from the collector surface diffused region (412) to the base region (414). The collector surface diffused region (412) may be formed in the same process operations that form the source and drain region of N-channel MOS transistors in said integrated circuit. The emitters (416) of the bipolar transistor are n-type silicon, and are typically formed in the same operations as the collector region at the surface of the wafer. The base contact diffusion region (418) at the surface of the wafer is p-type silicon, and may be formed in the same process operations that form the source and drain region of P-channel MOS transistors in said integrated circuit. Base, emitter and collector regions may be separated by an isulating layer partially penetrating into the substrate (not shown for clarity), typically comprised of silicon dioxide, typically formed by local oxidation of silicon (LOCOS) or shallow trench isolation (STI). Metal silicide (420, 422, 424) may be formed on the top surfaces of the collector, base and emitter, respectively, to reduce the contact series resistance. A plurality of contact islands (426), including silicide, if used, is formed on the top surface of the emitter. The plurality of emitter diffused regions and segmentation of contact and silicide area are advantageous as they result in a distributed emitter diffusion drift resistance network which counteracts any local increase of current across the emitter during ESD stress and therefore delays current crowding, reducing current crowding. Contacts are made to the collector (428) and to the emitter (430) and to the base (432) to connect the bipolar transistor to the ESD protection circuit. The combined area of the emitter-base junctions (434) is sized appropriately to carry the anticipated ESD discharge current and power at a desired voltage drop. If silicide is used, the metal silicide islands over the emitter is preferably offset from the edge of the emitter diffused region to form a drift region along an edge of the emitter.

External resistors, such as polysilicon resistors or metal interconnect meander resistors, may be connected to each emitter contact island to increase ballasting.

It will be recognized by those familiar with bipolar transistor fabrication that a bipolar transistor of opposite polarity from that described in reference to FIG. 1, namely a pnp bipolar transistor, may be fabricated to have a plurality of contact islands on an emitter, by following the discussion in reference to FIG. 1, with an appropriate change in doping and polarity of some elements, including the collector, base and emitter.

FIG. 5 is a set of top views of emitters of bipolar transistors in ESD protection circuits with multiple emitter diffused regions and one contact island per emitter diffused region, and a drift region around each contact island, according to an embodiment of the instant invention.

Figure 5A:
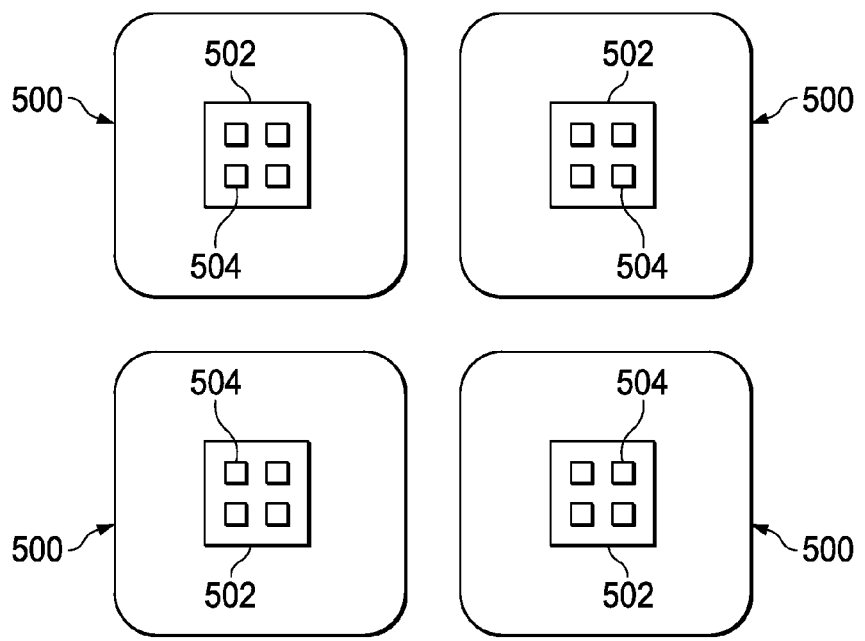
FIG. 5 is a top view of the emitter region of a bipolar transistor in an ESD protection circuit with multiple emitter diffused regions and one contact island per emitter diffused region according to an embodiment of the instant invention.

FIG. 5A depicts an embodiment of the instant invention wherein a plurality of emitter diffused regions (500) comprises the emitter of the bipolar transistor, with one arbitrarily shaped contact island (502), which may include metal silicide on the surface of the emitter in the island region (502), per emitter region. Each contact island is contacted by metal vias (504). If silicide is used, the boundary of each silicide region extends to the boundary of the corresponding contact island. If silicide is not used, the contacts are configured in a plurality of contact islands.

Figure 5B:
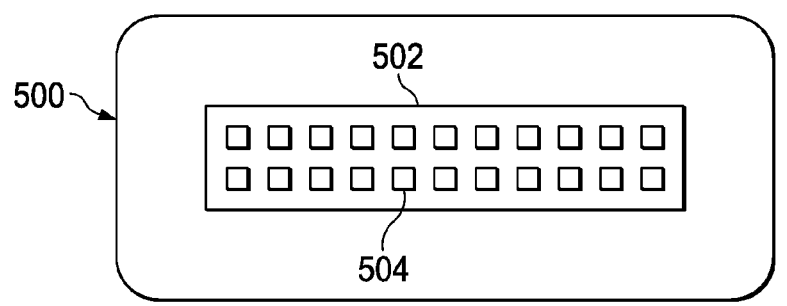
Figure 5B:
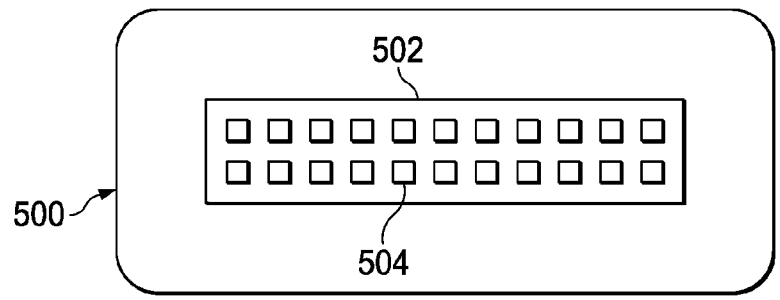
Figure 5B:
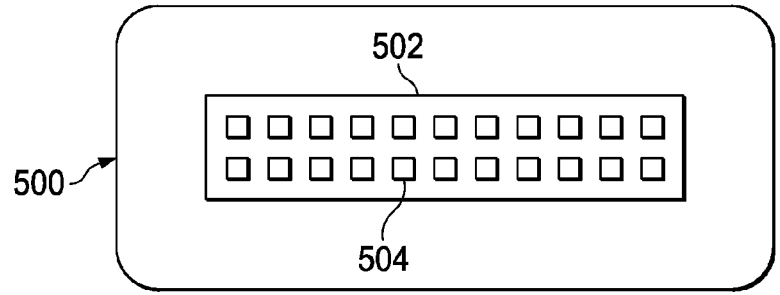

FIG. 5B depicts another embodiment of this invention wherein a plurality of elongated emitter diffused regions (500) comprises the emitter of the bipolar transistor, with one elongated contact island (502) per emitter region. Each contact island is contacted by metal vias (504). This configuration may be used for emitter lengths shorter than a typical current filament. If silicide is used, the boundary of each silicide region extends to the boundary of the corresponding contact island. If silicide is not used, the contacts are configured in a plurality of contact islands.

A plurality of emitter diffused regions can be advantageous to spread the power density in the underlying collector or to modulate the gain of the transistor. In some circuits, a plurality of emitter diffused regions separated by base contact areas can be advantageous to in order to maintain a homogeneous gain across the transistor.

It is within the scope of this invention to have bipolar transistors with a plurality of emitter diffused regions having other configurations of collector, base and emitter regions, including, but not limited to, circular, oval, comb and serpent, and square. Emitter diffused regions may be configured concentrically.

FIG. 6 is a set of top views of emitters of bipolar transistors in ESD protection circuits with a plurality of emitter diffused regions and a plurality of contact islands in each emitter diffused region, and a drift region around each contact island, according to embodiments of the instant invention invention.

Figure 6A:
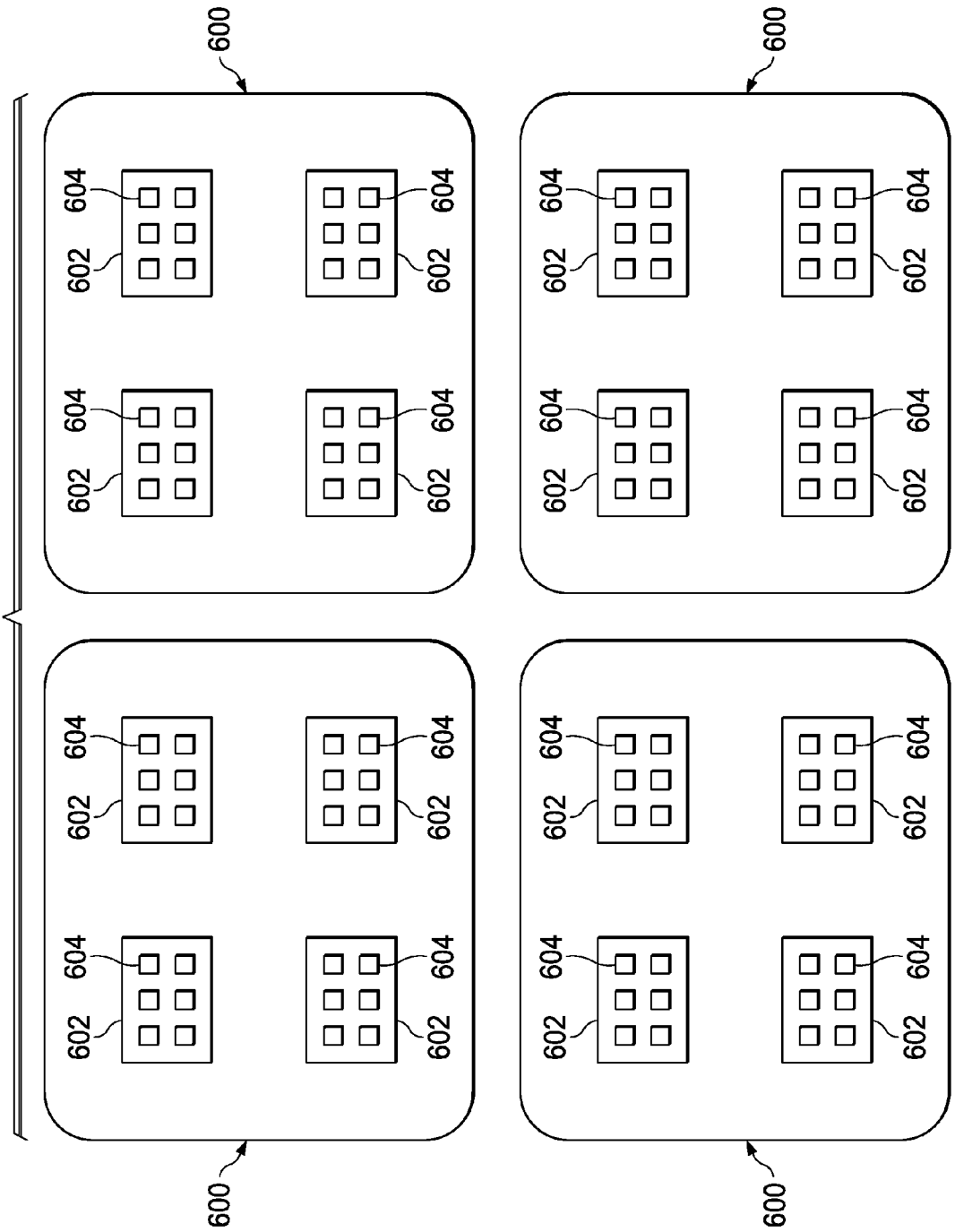
FIG. 6 is a top view of the emitter region of a bipolar transistor in an ESD protection circuit with multiple emitter diffused regions and multiple contact islands per emitter diffused region according to an embodiment of the instant invention.

FIG. 6A depicts an embodiment of this invention wherein a plurality of arbitrarily shaped emitter diffused regions (600) comprises the emitter of the bipolar transistor, with a plurality of contact islands (602) per emitter region. Each contact island is contacted by metal vias (604). This configuration may be used with emitters larger than typical current filament lengths. If silicide is used, the boundary of each silicide region extends to the boundary of the corresponding contact island. If silicide is not used, the contacts are configured in a plurality of contact islands.

Figure 6B:
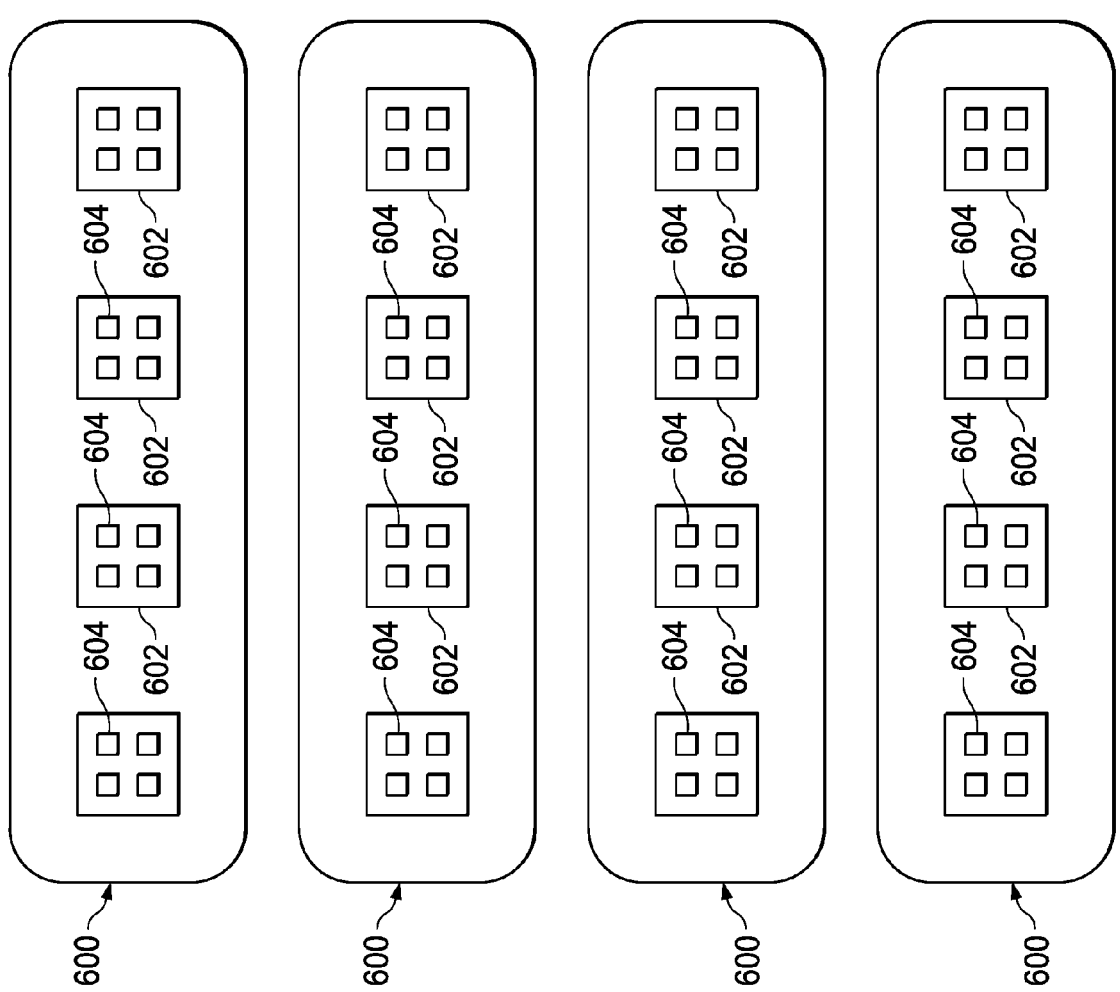

FIG. 6B depicts another embodiment of this invention wherein a plurality of elongated emitter diffused regions (600) comprises the emitter of the bipolar transistor, with a plurality of elongated contact islands (602) per emitter region. Each contact island is contacted by metal vias (604). This configuration may be used with emitter lengths comparable to a typical current filament. If silicide is used, the boundary of each silicide region extends to the boundary of the corresponding contact island. If silicide is not used, the contacts are configured in a plurality of contact islands.

The advantages of segmenting the contacts and of a plurality of emitter diffused regions are both realized in the embodiments depicted in FIG. 6.

It is within the scope of this invention to have bipolar transistors with a plurality of emitter diffused regions and a plurality of contact islands in each emitter diffused region having other configurations of collector, base and emitter regions, including, but not limited to, circular, oval, comb and serpent, and square.

What is claimed is:

1. An integrated circuit, comprising an ESD device including:
   a semiconductor substrate including an isolated bipolar transistor region;
   an epitaxial layer of semiconductor material having a given conductivity type formed over the substrate in the isolated region;
   a buried collector region of the given conductivity type formed in the isolated region in one or both of the epitaxial layer and substrate;
   a connector region of the given conductivity type formed in the epitaxial layer and extending between a surface of the epitaxial layer and the buried collector region;
   a collector region of the given conductivity type formed at the surface in the connector region;
   a base well region of opposite conductivity type formed in the epitaxial layer adjacent the surface at a location different from the location of the collector region;
   a base region of the opposite conductivity type formed at the surface in the base well region;
   an emitter region of the given conductivity type formed at the surface in the base well region at a location spaced from the location of the base region; and
   contacts respectively formed to provide electrical contact to the collector region, the base region and the emitter region;
   wherein the contacts formed to provide electrical contact to the emitter region comprise a plurality of via clusters to a single diffused region of the emitter region, wherein the via clusters are separated from each other and each of the via clusters provides a multi-dimensional array of vias; and
   wherein the contacts formed to provide the electrical contact to the emitter region further comprise metal silicide island areas formed in spaced positions over the emitter region offset from edges of the emitter region; and each of said via clusters providing electrical contact to a respective different one of the metal silicide island areas.

2. The circuit of claim 1, wherein the given conductivity type is n-type conductivity, and the opposite conductivity type is p-type conductivity.

3. The circuit of claim 1, wherein the emitter region is located between the collector region and the base region.

4. The circuit of claim 1, wherein the emitter region comprises a plurality of emitter regions of the given conductivity type formed in spaced positions at the surface in the base well region; and wherein the contacts formed to provide electrical contact to the emitter region comprise more than one of said via clusters to each emitter region.

5. The circuit of claim 1, wherein the contacts to the base region further comprise another via cluster in contact with an area of metal silicide formed over and coterminous with the base region.

6. The circuit of claim 5, wherein the contacts to the collector region further comprise yet another via in contact with another area of metal silicide formed over and coterminous with the collector region.

7. The circuit of claim 6, wherein the base region comprises first and second base regions formed in spaced locations at the surface in the base well region; and the emitter region is formed between the first and second base regions.

8. The circuit of claim 1, wherein the base region comprises first and second base regions formed in spaced locations at the surface in the base well region; and the emitter region is formed between the first and second base regions.

9. A method of fabricating an integrated circuit including an ESD device, comprising:
   providing a semiconductor substrate including an isolated bipolar transistor region;
   forming an epitaxial layer of semiconductor material having a given conductivity type over the substrate in the isolated region;
   forming a buried collector region of the given conductivity type in the isolated region in one or both of the epitaxial layer and substrate;
   forming a connector region of the given conductivity type in the epitaxial layer and extending between a surface of the epitaxial layer and the buried collector region;
   forming a collector region of the given conductivity type at the surface in the connector region;
   forming a base well region of opposite conductivity type in the epitaxial layer adjacent the surface at a location different from the location of the collector region;
   forming a base region of the opposite conductivity type at the surface in the base well region;
   forming an emitter region of the given conductivity type at the surface in the base well region at a location spaced from the location of the base region; and
   forming contacts to respectively provide electrical contact to the collector region, the base region and the emitter region;
   wherein the contacts formed to provide electrical contact to the emitter region are formed to comprise a plurality of via clusters to a single diffused region of the emitter region, wherein the via clusters are separated from each other and each of the via clusters provides a multi-dimensional array of vias; and wherein forming the contacts to provide the electrical contact to the emitter region further comprises forming metal silicide island areas in spaced positions over the emitter region offset from edges of the emitter region; and each of said via clusters providing electrical contact to a respective different one of the metal silicide island areas.

10. The circuit of claim 9, wherein the given conductivity type is n-type conductivity, and the opposite conductivity type is p-type conductivity.

11. The circuit of claim 9, wherein the emitter region is located between the collector region and the base region.

12. The circuit of claim 9, wherein forming the emitter region comprises forming a plurality of emitter regions of the given conductivity type in spaced positions at the surface in the base well region; and wherein forming the contacts to provide electrical contact to the emitter region comprises forming more than one of said via clusters to each emitter region.

13. The circuit of claim 9, wherein forming the contacts to the base region further comprises forming another via cluster in contact with an area of metal silicide formed over and coterminous with the base region.

14. The circuit of claim 13, wherein forming the contacts to the collector region further comprises forming yet another via cluster in contact with another area of metal silicide formed over and coterminous with the collector region.

15. The circuit of claim 14, wherein forming the base region comprises forming first and second base regions in spaced locations at the surface in the base well region; and the emitter region is formed between the first and second base regions.

16. The circuit of claim 9, wherein forming the base region comprises first and second base regions in spaced locations at the surface in the base well region; and the emitter region is formed between the first and second base regions.

* * * * *